United States Patent [19]
Ishisaka et al.

[11] Patent Number: 5,814,879
[45] Date of Patent: Sep. 29, 1998

[54] TAPE CARRIER DEVICE HAVING AN ADHESIVE RESIN OVERCOAT AND A POLYIMIDE RESIN-BASED OVERCOAT

[75] Inventors: Masaharu Ishisaka, Okegawa; Takeshi Nou, Ageo; Naoyuki Tajima, Osaka, all of Japan

[73] Assignees: Mitsui Mining & Smelting Co., Ltd.; Sharp Kabushiki Kaisha, both of Osaka, Japan

[21] Appl. No.: 538,627

[22] Filed: Oct. 4, 1995

Related U.S. Application Data

[62] Division of Ser. No. 98,428, Jul. 27, 1993, Pat. No. 5,477,080.

[30] Foreign Application Priority Data

Jan. 20, 1992 [JP] Japan ............................. HEI 4-27531
Dec. 28, 1992 [JP] Japan ............................ HEI 4-358607

[51] Int. Cl.⁶ .......................... H01L 23/495; H01L 23/29
[52] U.S. Cl. ........................... 257/668; 257/790; 257/792
[58] Field of Search ................................. 257/668, 790, 257/792

[56] References Cited

U.S. PATENT DOCUMENTS

| | | | |
|---|---|---|---|
| 5,176,366 | 1/1993 | Masumoto et al. | 257/668 |
| 5,357,400 | 10/1994 | Takekawa | 257/668 |
| 5,359,222 | 10/1994 | Okutomo et al. | 257/659 |

*Primary Examiner*—Teresa M. Arroyo
*Attorney, Agent, or Firm*—Bucknam and Archer

[57] ABSTRACT

A tape carrier comprises an insulating film and a pattern formed of a metal foil on at least one side surface of said film, said tape carrier being characterized in that an adhesive resin overcoat is applied to the pattern surface portion around a portion to be coated with an IC sealing resin, and a polyimide resin-based overcoat is applied to the remaining pattern surface portion.

15 Claims, 8 Drawing Sheets

TAPE CARRIER DEVICE HAVING AN ADHESIVE RESIN OVERCOAT AND A POLYIMIDE RESIN-BASED OVERCOAT

This is a Divisional of application Ser. No. 08/098,428, filed Jul. 27, 1993 now U.S. Pat. No. 5,477,080.

BACKGROUND OF THE INVENTION

1. [Field of the Invention]

The present invention relates to a tape carrier (film carrier) and a tape carrier device mounted with an integrated circuit (IC).

2. [Prior Art]

As a conventional method of connecting an IC to a tape carrier to produce a semiconductor component for use in the tape automated bonding (TAB) method or the like, the following two methods are most popular.

One method comprises forming a device hole in an insulating film, having inner leads formed of a conductor such as mainly copper overhang in the device hole and then connecting the inner leads to Au metal bumps formed on IC chip electrodes by thermocompression bonding or the like. Alternatively, the bumps may beforehand be formed on the inner leads to bond the inner leads to the IC chip electrodes.

The other method comprises forming patterns on both surfaces of a tape carrier, forming electrode pads on one surface at positions corresponding to the electrodes of an IC chip, electrically connecting the electrode pads to wiring leads formed on the other surface through through-holes and then bonding the electrode pads on the tape carrier to the IC chip electrodes having solder bumps formed thereon.

Such a tape carrier is sealed with a sealing resin consisting of an epoxy-based resin or the like after bonding of IC to the carrier, and then outer leads are bonded to another substrate by soldering, an anisotropic conductive film, a photo-curable insulating resin, or the like. To prevent formation of a solder bridge during soldering, to prevent pattern short-circuiting and corrosion caused by conductive foreign materials, to prevent reliability degradation caused by electromigration and formation of a whisker, to mask a portion free from plating for pattern finishing using Sn, Au or solder and to prevent outflow of the IC sealing resin to a portion connected to the substrate, an overcoat resin is generally applied, prior to IC bonding, to wiring patterns except for portions contributing to bonding.

As a conventional overcoat resin, an epoxy-based solder resist having a high strength of adhesion to an IC sealing epoxy-based resin, such as a CCR240GS (trade name) available from Asahi Kagaku Kenkyu-sho, has been used. In recent tape carriers having a high-density pattern, warping of tape carriers which is caused by a difference between the thermal shrinkage or expansion coefficients of the overcoat resin and an insulating polyimide film mainly causes a decrease in yield and reliability particularly during bonding of outer leads.

Figure 1:
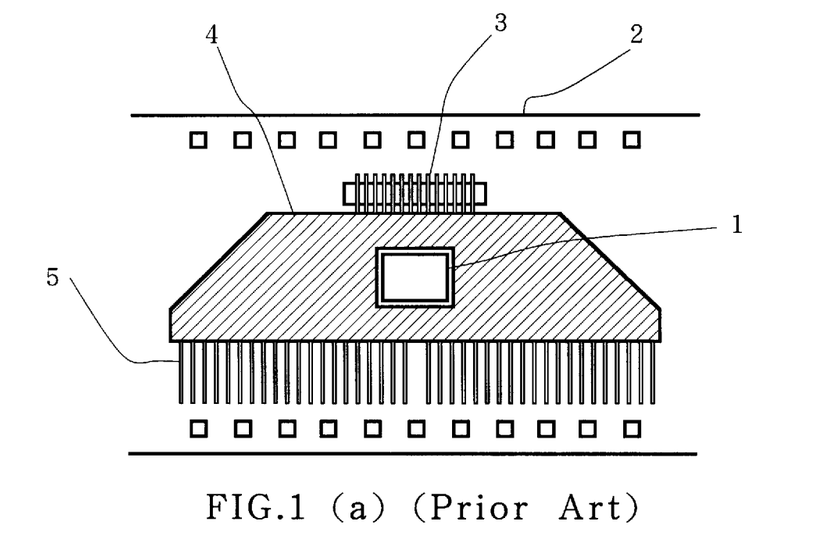
FIGS. 1(a) and 1(b) are schematic plan views showing a conventional tape carrier and a conventional tape carrier device, which are used for producing a liquid crystal driver, respectively.

A conventional tape carrier coated with such an overcoat resin and a tape carrier device mounted with an IC thereon are shown in FIGS. 1(a) and 1(b), respectively. Referring to FIGS. 1(a) and 1(b), reference numeral 1 denotes a device hole; 2, an insulating film (tape); 3, a copper film pattern (The greater part of the pattern is coated with an overcoat resin 4 and, thus, only a non-coated portion is shown.); 4, an adhesive resin overcoat such as an epoxy resin-based one (epoxy-based solder resist); 5, outer leads; and 7, an IC sealing resin.

FIGS. 1(a) and 1(b) show a tape carrier and a tape carrier device for a liquid crystal driver. Inner leads overhanging in the device hole 1 are connected to an IC, and the connection portion and an IC circuit formation surface are covered mainly with an epoxy-based IC sealing resin. An epoxy resin-based overcoat 4 called a solder resist is applied to the wiring pattern formed on the tape carrier prior to IC connection. After the tape carrier device is confirmed to be a nondefective product by an electrical test after IC sealing, the outer leads 5 are bonded by an anisotropic conductive film or the like to an electrode pattern onto a glass substrate serving as a liquid crystal panel. At this time, the flatness of the outer leads portion of the tape carrier greatly influences workability and yields of the bonding step as well as reliability of the bonded portion. As described above, warping of the tape carrier will raise a serious problem when a conventional epoxy resin-based overcoat is attempted to be coated on the warped tape carrier.

Figure 2:
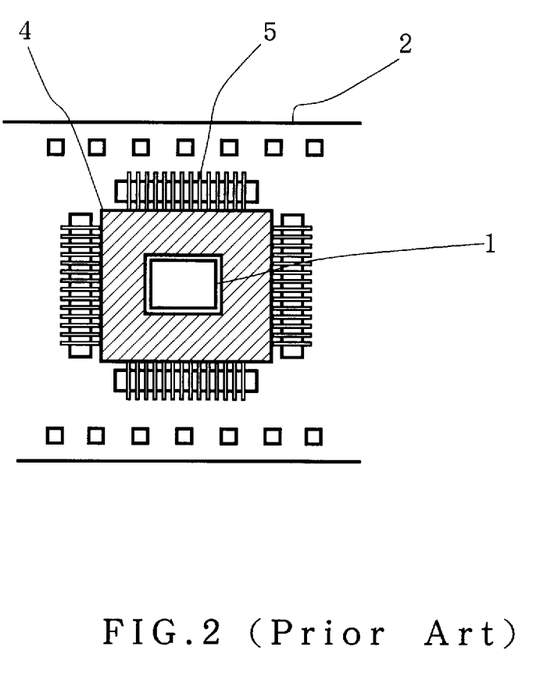
FIG. 2 is a schematic plan view showing another conventional tape carrier.

FIG. 2 shows a conventional tape carrier different in type from that shown in FIG. 1(a). The same reference numerals in FIG. 2 as in FIG. 1(a) denote the same parts as in FIG. 2. Even the conventional tape carrier of the type shown in FIG. 2 is generally coated on its conventional pattern portion with an epoxy resin-based overcoat and, in this case, warping of the carrier tape will also pose a serious problem on forming and soldering outer leads 5 to a substrate.

A recently developed polyimide resin-based overcoat such as an FS100 (trade name) available from Ube Industries, Ltd. has a remarkable effect to prevent warping of the tape carrier and, therefore, the problem posed by warping can be solved by the use of the polyimide resin-based overcoat. However, the strength of adhesion of the polyimide resin-based overcoat to an IC scaling resin is low, so that reliability of the tape carrier device decreases due to changes in temperature and humidity after mounting an IC on the tape carrier.

SUMMARY OF THE INVENTION

The present invention has been made to solve such conventional technical problems as described above. An object of the present invention is to provide a tape carrier and a tape carrier device which do not lower the adhesiveness of an overcoat resin to an IC sealing resin, remarkably lower warping and reliability is improved.

The above object of the present invention can be achieved by the following tape carrier.

The tape carrier of the present invention is one which comprises an insulating film and a metal film-made pattern formed on at least one side surface of said film and is characterized in that an adhesive resin overcoat is applied to a pattern surface portion located around a portion to be coated with an IC sealing resin, and a polyimide resin-based overcoat is applied to the remaining pattern surface.

DETAILED DESCRIPTION OF THE PREFERRED EMBODIMENTS

The present invention will be explained in more detail with reference to the accompanying drawings.

Figure 3:
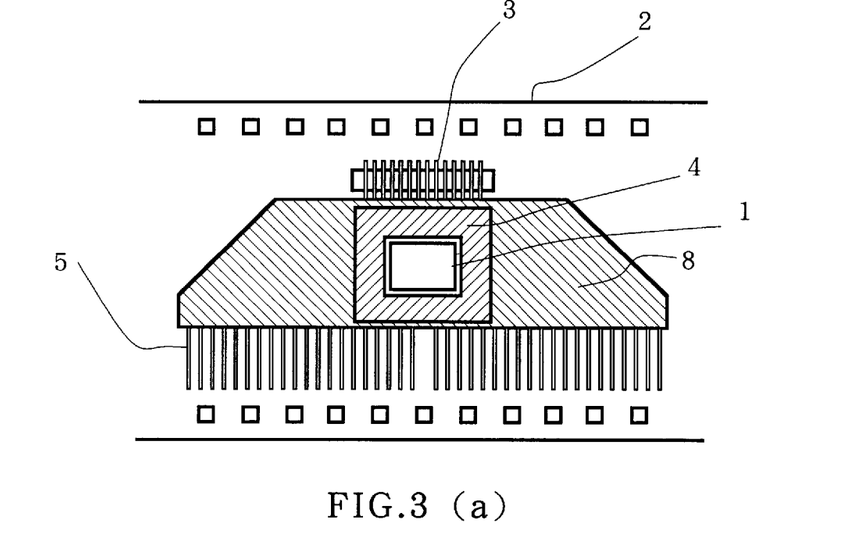
FIGS. 3(a) and 3(b) are schematic plan views showing a tape carrier and a tape carrier device, which are used for producing a liquid crystal driver, according to the first embodiment of the present invention, respectively.

FIGS. 3(a) and 3(b) show a tape carrier of the present invention for a liquid crystal driver and a tape carrier device of the present invention mounted with an IC and used for producing a liquid crystal driver, respectively. The same reference numerals in FIGS. 3(a) and 3(b) as used in FIGS. 1(a) and 1(b) denote the same parts as used in FIGS. 1(a) and 1(b). Reference numeral 8 denotes a polyimide resin-based overcoat.

In FIGS. 3(a) and 3(b), two kinds of overcoat resin 4 and 8 are used. The adhesive resin overcoat resin 4 having a high strength of adhesion to an IC sealing resin is applied to the peripheral portion of a device hole 1, i.e., onto the pattern surface portion located around a portion to be coated with an IC sealing resin (the portion being hereinafter referred to as "a portion to be coated with an IC sealing resin"). The polyimide resin-based overcoat 8 for minimizing warping of the tape carrier is applied to the remaining pattern surface portion. Since overcoat resins are generally applied in accordance with a screen printing method, in consideration of precision printing, these two overcoat 4 and 8 are applied to a region in such a manner that applications of the two overcoats to the region overlap each other on a part of the region, or the adhesive resin overcoat 4 is applied around the portion to be coated with the IC sealing resin after the polyimide resin-based overcoat 8 has been applied to the entire pattern surface. The adhesive resin overcoat is most generally exemplified by an epoxy resin-based overcoat. However, other overcoat resins such as an epoxy-acrylate resin-based overcoat, a melamine resin-based overcoat and an alkyd resin-based overcoat may be used as the adhesive resin overcoat. These overcoat resins are excellent in strength of adhesion to an IC sealing resin. The polyimide resin-based overcoat is generally exemplified by a polycondensate of an aromatic tetrabasic acid and a diamine (e.g., a polycondensate of pyromellitic dianhydride and an aromatic diamine, and a polycondensate of biphenyltetracarboxylic dianhydride and a diamine) and a derivative thereof.

Figure 4:
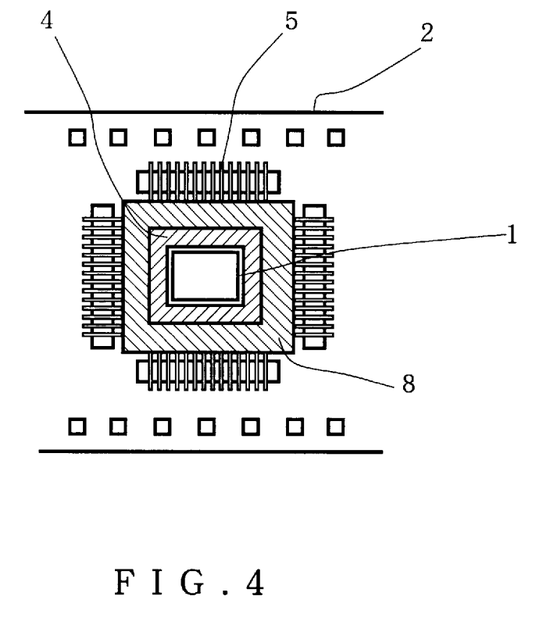
FIG. 4 is a schematic plan view showing a tape carrier according to the second embodiment of the present invention.

FIG. 4 shows a tape carrier of the present invention which Is different from that shown in FIG. 3(a). The same reference numerals in FIG. 4 as in FIGS. 3(a) and 3(b) denote the same parts in FIG. 4 as in FIGS. 3(a) and 3(b). As in FIGS. 3(a) and 3(b), an adhesive resin overcoat 4 is applied to a pattern surface portion located around a portion to be coated with an IC sealing resin, and a polyimide resin-based overcoat 8 is applied to the remaining pattern surface portion, thereby obtaining a tape carrier having a higher strength of adhesion to the IC sealing resin, high reliability and minimized warping.

It is possible to apply two or more types of overcoat resins to other respective desired portions in addition to the portion located around the portion to be coated with IC sealing resin to provide the tape carrier with various functions.

For example, the conductor width of a recent high-density wiring pattern is also much smaller than that of a conventional one. A polyimide resin-based overcoat has a somewhat lower strength of adhesion to the surface of a conductor such as copper than a conventional epoxy resin-based overcoat. For this reason, when the conductor width of a wiring pattern is very small and the pattern is highly dense, the strength of adhesion between the end portion of the coated polyimide resin-based overcoat and the surface of the conductor such as copper decreases. In the subsequent plating process, plating components permeate into the end portion of the coated overcoat to cause corrosion of the conductor. As a result, migration occurs to decrease reliability.

Figure 5:
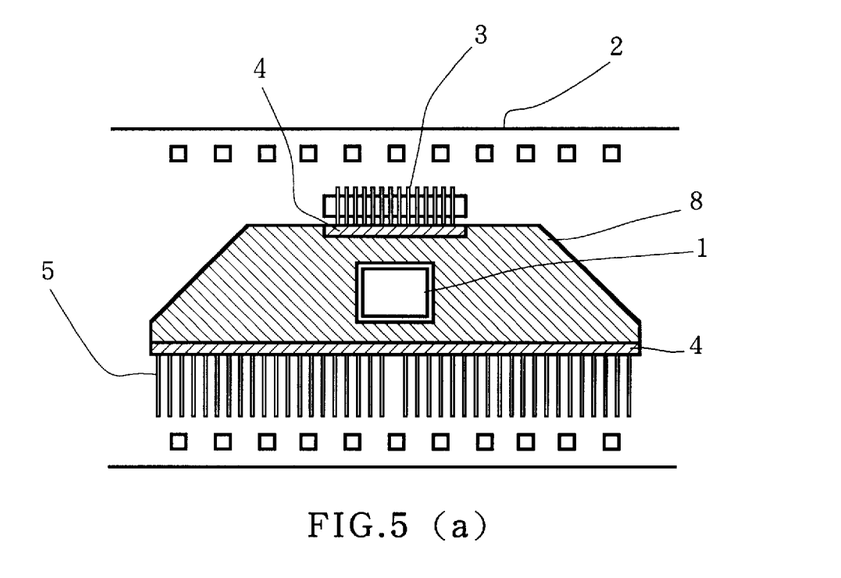
FIGS. 5(a) and 5(b) are schematic plan views showing a tape carrier and a tape carrier device, which are used for producing a liquid crystal driver, according to the third embodiment of the present invention, respectively.

To prevent such migration, it is preferable to use a tape carrier shown in FIG. 5(a) and a tape carrier device mounted with an IC shown in FIG. 5(b), which are used for producing a liquid crystal driver. The same reference numerals in FIGS. 5(a) and 5(b) as in FIGS. 3(a) and 3(b) denote the same parts in FIGS. 5(a) and 5(b) as in FIGS. 3(a) and 3(b).

Referring to FIGS. 5(a) and 5(b), an adhesive overcoat 4 having a high strength of adhesion to copper or the like is applied to end portions of a pattern surface the greater part of which is coated with a polyimide resin-based overcoat 8. As described above, the overcoat resins are generally applied in accordance with a screen printing method. Thus, in consideration of precision printing, these two overcoat resins 4 and 8 are applied to a region in such a manner that applications of the overcoat resins 4 and 8 to the region overlap each other on a part of the region, or the adhesive resin overcoat 4 is applied to only the end portion of the pattern surface after the polyimide resin-based overcoat 8 has been applied to the entire pattern surface. The adhesive resin overcoat is generally exemplified by an epoxy resin-based overcoat. However, other overcoat resins such as an epoxy-acrylate resin-based overcoat, a melamine resin-based overcoat and an alkyd resin-based overcoat may be used as the adhesive resin overcoat. These overcoat resins are excellent in strength of adhesion to a conductor such as copper. In this tape carrier, the adhesive resin overcoat may of course be applied to the pattern surface portion around the portion to be coated with the IC sealing resin.

An IC sealing resin is generally applied by a potting method and therefore has a very low viscosity. Since the IC sealing resin tends to flow out before hardened, it is difficult to achieve precision application of said sealing resin.

In the tape carrier shown in FIG. 3(a), the adhesive resin overcoat 4 having a high strength of adhesion to an IC sealing resin is applied to the peripheral portion of the device hole 1, i.e., to the pattern surface portion around the portion to be coated with IC sealing resin, and the polyimide resin-based overcoat 8 which will minimize warping is applied to the remaining pattern surface portion. Even in the tape carrier so coated, if the tape carrier portion coated with the adhesive resin overcoat is very broad, warping the tape carrier will increase due to thermal shrinkage and the like of the adhesive resin overcoat, so that the tape carrier in reliability will be affected tape carrier portion coated with the adhesive resin overcoat is narrow, the IC sealing resin will flow out to within the portion coated with the polyimide resin-based overcoat. Since the adhesion force between the polyimide resin-based overcoats and the IC sealing resin is small, these overcoats and resin coated on a tape carrier will be cracked and peeled from each other during transportation and field applications after mounting the tape carrier with an IC, so that reliability of the tape carrier device is affected.

Figure 6:
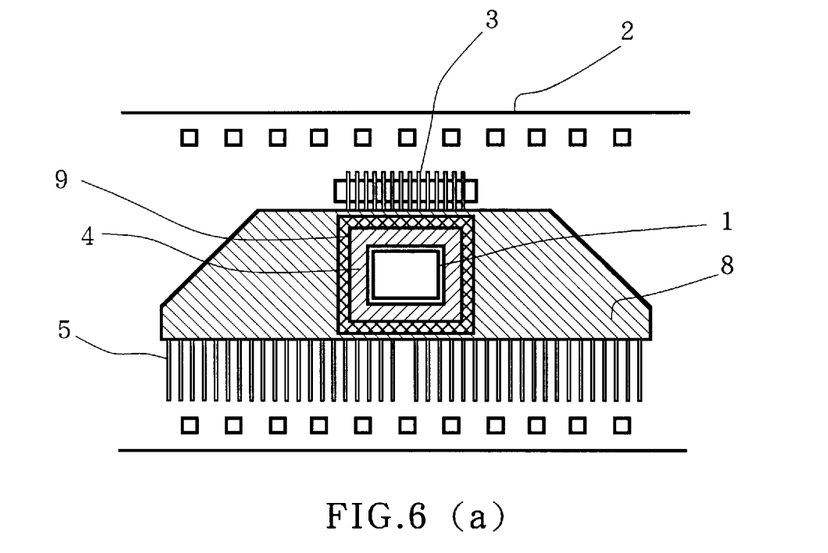
FIGS. 6(a) and 6(b) are schematic plan views showing a tape carrier and a tape carrier device, which are used for producing a liquid crystal driver, according to the fourth embodiment of the present invention, respectively.

A tape carrier and a tape carrier device mounted with an IC for a liquid crystal driver, which can solve the above problem, are shown in FIGS. 6(a) and 6(b). In FIGS. 6(a) and 6(b), reference numeral 9 denotes an overcoat resin which can repel an IC sealing resin.

FIG. 6(a) shows the tape carrier in which the overcoat resin (e.g., a silicone resin-based overcoat) 9 capable of repelling the IC sealing resin 7 is applied to a boundary portion between the portion to be coated with the IC sealing resin and the remaining pattern surface portion. By applying the overcoat resin 9 capable of repelling the IC sealing resin, flowing-out of the IC sealing resin 7 can be prevented, and the area to be coated with the adhesive resin overcoat 4 having a high strength of adhesion to the IC sealing resin can controllably be reduced. For this reason, a tape carrier having less warping can be obtained regardless of types of IC sealing resins. Further, since the area to be coated with the IC sealing resin-coated area can be lessened in such a tape carrier, a more compact tape carrier device can be obtained.

Figure 7A:
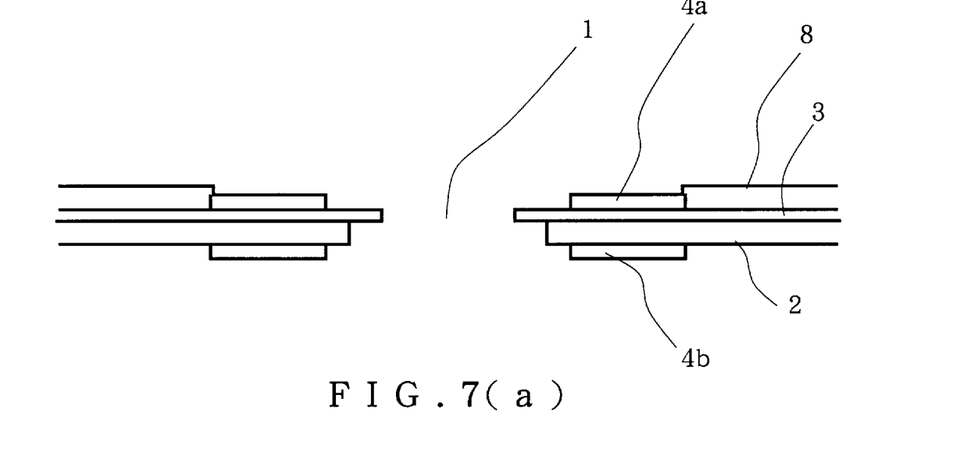
FIGS. 7(a) and 7(b) are schematic sectional views showing a tape carrier and a tape carrier device, according to the fifth embodiment of the present invention, respectively.
Figure 7B:
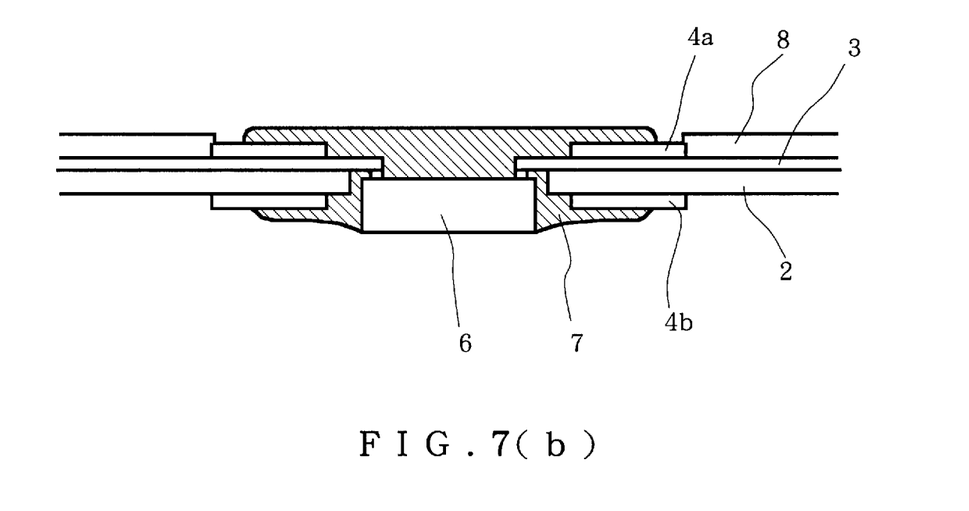

In the tape carrier of the present invention, an adhesive resin overcoat may be applied to the insulating film surface on which no pattern is formed to effectively improve the reliability of the resultant tape carrier device. A polyimide resin-based film is generally used as a typical insulating film for the tape carrier, and Upilex (trade name) available from Ube Industries, Ltd. and Kapton (trade name) available from Toray-Du Pont are widely used. Some IC sealing resins have a low strength of adhesion to such a polyimide resin-based insulating film. By applying an adhesive resin overcoat to the insulating film surface on which no pattern is formed and an IC sealing resin is to be coated, a sufficient adhesiveness or bond between the IC sealing resin and the insulating film can be secured. FIGS. 7(a) and 7(b) are sectional views of a tape carrier having such a structure and a tape carrier device using this tape carrier therein, respectively. The IC sealing resin can obtain a sufficiently high adhesion strength on both surfaces of the tape carrier by means of the adhesive resin overcoat 4b applied to the insulating film surface having no pattern formed thereon and the adhesive resin overcoat 4a applied to the pattern surface.

Figure 8A:
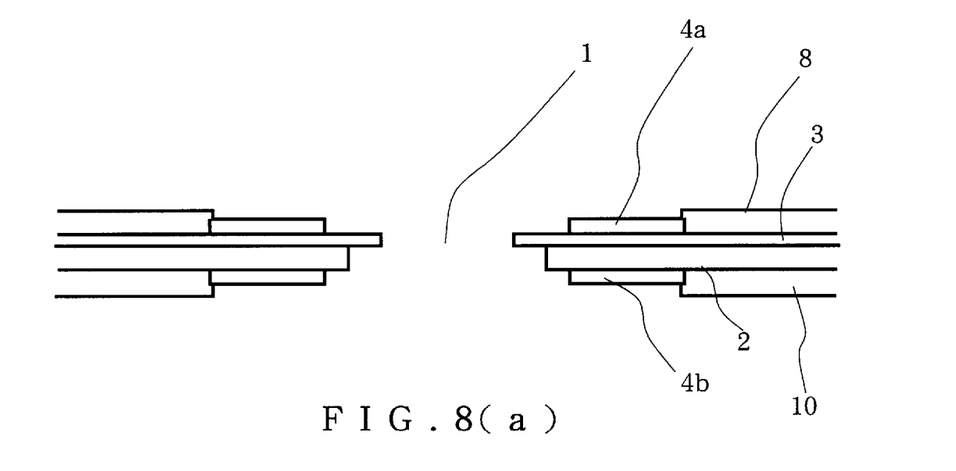
FIGS. 8(a) and 8(b) are schematic sectional views showing a tape carrier and a tape carrier device, according to the sixth embodiment of the present invention, respectively.
Figure 8B:
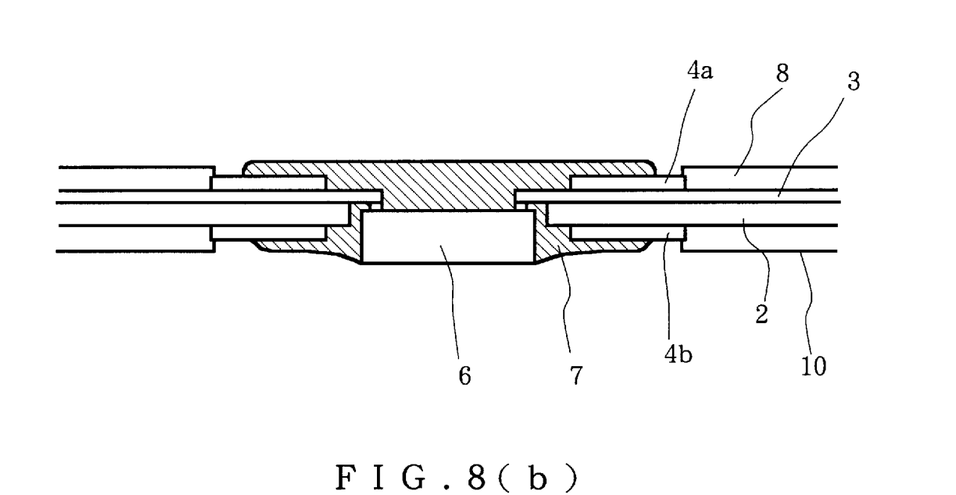

As shown in the sectional views of the tape carrier in FIG. 8(a) and the tape carrier device in FIG. 8(b), an overcoat resin 10 is applied to the insulating film surface portion except for the portion to be coated with the IC sealing resin so that warping of the tape carrier cancels shrinkage caused by the overcoat resin 8 on the circuit side thereby to minimize the warping of the tape carrier.

As described above, since warping of the tape carrier of the present invention can be minimized without impairing adhesiveness among the IC sealing resin, the conductor and the insulating film, as a result, workability of bonding outer leads, a product yield and the reliability of the resultant tape carrier device can be improved.

Further, since an IC sealing resin area can be lessened in the tape carrier of the present invention, a more compact-sized tape carrier device can be provided.

PREFERRED EMBODIMENTS OF THE PRESENT INVENTION

The present invention will now be described by way of its examples and comparative examples.

EXAMPLE 1

An epoxy resin-based overcoat 4 was applied in a width of 2 mm and a thickness of 15 μm around a device hole 1 of a tape carrier having a pattern 3 for a liquid crystal driver, and a polyimide resin-based overcoat 8 was applied in a thickness of 15 μm to the remaining pattern portion to form a tape carrier as shown in FIG. 3(a).

An IC was bonded to this tape carrier and sealed with an epoxy-based IC sealing resin 7 to prepare a tape carrier device as shown in FIG. 3(b).

Magnitudes of warping of the resultant tape carrier device samples were measured. In addition, a voltage of 100 V was applied to these samples at a temperature of 85° C. and a humidity of 85% to measure an initial dielectric resistance and a dielectric resistance after 2,000 hours. In this case, a tape carrier device sample having a dielectric resistance of $10^8$ Ω or less was defined as a defective sample, and the above tape carrier device samples were evaluated by calculating the number of defective samples out of 20 samples tested.

As a result, the magnitudes of warping of the samples were as small as 1 mm. The numbers of defective samples were found to be zero at the time of initial measurement and subsequent measurement after 2,000 hours.

COMPARATIVE EXAMPLE 1

An epoxy resin-based overcoat 4 was applied in a thickness of 15 μm to the entire pattern surface of a tape carrier having a pattern 3 for a liquid crystal driver to prepare a tape carrier as shown in FIG. 1(a). An IC was bonded to this tape carrier and sealed with an epoxy-based IC sealing resin 7 to obtain a tape carrier device as shown in FIG. 1(b).

Magnitudes of warping of the resultant tape carrier device samples were measured, and the initial dielectric resistances and subsequent dielectric resistances after 2,000 hours of these samples were measured by following the same procedure as in Example 1.

Although the numbers of defective samples found at the time of initial measurement and subsequent measurement after 2,000 hours were zero, the magnitudes of warping of the samples were as large as 5 mm.

COMPARATIVE EXAMPLE 2

The procedure of Comparative Example 1 was followed except that a polyimide resin-based overcoat was substituted for the epoxy rein-based overcoat, so that a tape carrier was prepared to this tape carrier and sealed with an epoxy-based IC sealing resin to prepare a tape carrier device.

Magnitudes of warping of the resultant tape carrier device samples were measured, and the initial dielectric resistances and subsequent dielectric resistances after 2,000 hours of these samples were measured following the same procedure as in Example 1.

The magnitudes of warping of the samples were as small as 1 mm, and the number of defective samples found at the time of initial measurement was zero, but all of twenty samples tested became defective at the time of subsequent measurement after 2,000 hours.

EXAMPLE 2

An epoxy resin-based overcoat was applied in a width of 2 mm and a thickness of 15 μm to a pattern surface portion around a device hole and input/output outer leads in a tape carrier having a high-density pattern (an output outer lead conductor width of 40 μm) for a liquid crystal driver, and a polyimide resin-based overcoat was applied in a thickness of 15 μm to the remaining pattern portion to form a tape carrier of the present invention. An IC was bonded to the resultant tape carrier and sealed with an epoxy-based IC sealing resin to prepare a tape carrier device of the present invention.

The resultant tape carrier device samples were measured for their magnitude of warping, and they were also measured for their initial dielectric resistance and subsequent dielectric resistance after 2,000 hours in the same manner as in Example 1.

The result was that the magnitudes of warping of the samples were as small as 1 mm, and the numbers of defective samples found at the time of initial measurement and subsequent measurement after 2,000 hours were zero.

COMPARATIVE EXAMPLE 3

The procedure of Example 2 was followed except that input and output outerleads were coated with a polyimide resin-based overcoat in substitution for the epoxy resin-based overcoat, so that a tape carrier having a high-density pattern for a liquid crystal driver was prepared as shown in Example 2. An IC was bonded to this tape carrier and sealed with an epoxy-based IC sealing resin to prepare a tape carrier device.

Magnitudes of warping of the resultant tape carrier device samples were measured, and the initial dielectric resistances and subsequent dielectric resistances after 2,000 hours of these samples were measured following the same procedure as in Example 1.

The magnitudes of warping of the samples were as small as 1 mm, and the number of defective samples found at the time of initial measurement was zero, but all of twenty samples tested were found to be defective at the time of subsequent measurement after 2,000 hours because migration occurred in the outer leads.

EXAMPLE 3

A tape carrier as shown in FIG. 6(a) was prepared by applying an epoxy resin-based overcoat 4 in a width of 2 mm and a thickness of 15 μm around a device hole 1 of a tape carrier having the same pattern 3 for a liquid crystal driver as in Example 1, applying a polyimide resin-based overcoat 8 in a thickness of 15 μm to the remaining pattern portion and then applying a silicone resin-based overcoat 9 in a width of 1 mm to a boundary portion between the applied epoxy resin-based overcoat 4 and the applied polyimide resin-based overcoat 8. An IC was bonded to the resultant tape carrier and sealed with an epoxy-based IC sealing resin 7 having a viscosity of 1 ps slightly lower than that of a conventional sealing resin to prepare a tape carrier device as shown in FIG. 6(b).

Magnitudes of warping of the resultant tape carrier samples were measured. Further, initial dielectric resistances and subsequent dielectric resistances after 2,000 hours of the samples were measured following the same procedure as in Example 1.

The magnitudes of warping of the samples were as small as 1 mm. The application width of the IC sealing resin 7 was terminated at the boundary portion of the silicone resin-based overcoat 9. The numbers of defective samples found at the time of initial measurement and subsequent measurement after 2,000 hours were zero.

COMPARATIVE EXAMPLE 4

A tape carrier was prepared by applying an epoxy resin-based overcoat in a width of 2 mm and a thickness of 15 μm to around a device hole of a tape carrier having the same pattern for a liquid crystal driver as in Example 1, and then applying a polyimide resin-based overcoat in a thickness of 15 μm to the remaining pattern portion. An IC was bonded to the resultant tape carrier and sealed with an epoxy-based IC sealing resin having a viscosity of 1 ps slightly lower than that of a conventional sealing resin to prepare a tape carrier device.

Magnitudes of warping of the resultant tape carrier samples were measured. Further, initial dielectric resistances and dielectric subsequent resistances after 2,000 hours of the samples were measured following the same procedure as in Example 1.

The magnitudes of warping of the samples were as small as 1 mm. However, the application width of the IC sealing resin was 4 mm, which extended to the portion coated with the polyimide resin-based overcoat. Peeling occurred between the IC sealing resin and the polyimide resin-based overcoat during transportation of the tape carrier device. The numbers of defective samples in measurement of dielectric insulation after 2,000 hours were 16 out of 20.

EXAMPLE 4

A tape carrier as shown in FIG. 7(a) was prepared by applying an epoxy resin-based overcoat 4a in a width of 2 mm and a thickness of 15 μm to around a device hole 1 of a tape carrier having the same pattern 3 for a liquid crystal driver as in Example 1, applying a polyimide resin-based overcoat 8 in a thickness of 15 μm to the remaining pattern portion, and then applying an epoxy resin-based overcoat 4b in a width of 2 mm and a thickness of 15 μm to around the device hole 1 on one surface of the insulating film 2 opposite to the other side surface on which the pattern 3 has been formed. An IC 6 was bonded to the resultant tape carrier and sealed with an epoxy-based IC sealing resin 7 which is different in type from those used in Examples 1 to 3 to prepare a tape carrier device as shown in FIG. 7(b).

Magnitudes of warping of the resultant tape carrier device samples were measured, and the samples were bent up to an extent of forming an angle of 30° to check their cracks and peeling. Further, initial dielectric resistances and dielectric resistances after 2,000 hours of the samples were measured following the same procedure as in Example 1.

The magnitudes of warping of the samples were as small as 1 mm. No peeling or cracking occurred in the tested twenty samples. The numbers of defective samples found at the time of initial measurement and subsequent measurement after 2,000 hours were zero.

COMPARATIVE EXAMPLE 5

A tape carrier was prepared following the same procedure as in Example 4 except that the overcoat resin 4b was not applied to one surface of the insulating film opposite to the other surface thereof having a pattern formed thereon. An IC was bonded to the resultant tape carrier and sealed with the same epoxy-based IC sealing resin as in Example 4 to prepare a tape carrier device.

Magnitudes of warping of the resultant tape carrier device samples were measured, and the samples were bent up to an extent of forming an angle of 30° to check their cracks and peeling. Further, initial dielectric resistances and subsequent dielectric resistances after 2,000 hours of the samples were measured following the same procedure as in Example 1.

The magnitudes of warping of the samples were as small as 1 mm. However, peeling occurred in the IC sealing resin near the IC sealing portion on the side opposite to the pattern surface in all of the twenty samples tested. The tested twenty samples were all found defective at the time of measurement after 2,000 hours.

EXAMPLE 5

A tape carrier as shown in FIG. 8(a) was prepared by applying each of the epoxy resin-based overcoat 4a and 4b in a width of 2 mm and a thickness of 15 μm to around a device hole 1 on each of the pattern 3 surface and the surface of the insulating film 2 opposite to the pattern surface of the same tape carrier as in Example 4 and then applying each of the polyimide resin-based overcoat 8 and 10 a thickness of 15 μm to the remaining portion. An IC 6 was bonded to the resultant tape carrier and sealed with the same epoxy-based IC sealing resin 7 as in Example 4 to prepare a tape carrier device as shown in FIG. 8(b).

Magnitudes of warping of the resultant tape carrier device samples were measured, and the samples were bent at an angle up to 30° to check their cracks and peeling. Further, initial dielectric resistances and subsequent dielectric resistances after 2,000 hours of the samples were measured following the same procedure as in Example 1.

The magnitudes of warping of the samples were as small as 0.2 mm. Neither peeling nor cracking occurred in the twenty samples tested. The numbers of defective samples found at the time of initial measurement and subsequent measurement after 2,000 hours were zero.

What is claimed is:

1. A tape carrier comprising an insulating film, a pattern formed of a metal foil on at least one side surface of said film, a polyimide resin-based overcoat and an adhesive resin overcoat, said adhesive resin overcoat being made of a resinous material other than the resinous material of said polyimide resin-based overcoat, said adhesive resin overcoat being applied to a pattern surface portion around the periphery of a portion coated with an IC sealing resin, said polyimide resin-based overcoat being applied to the remaining pattern surface portion, said adhesive resin overcoat extending over said pattern surface portion, said polyimide resin-based overcoat having an area, said adhesive resin overcoat having an area, the area of said adhesive resin overcoat being smaller than the area of said polyimide resin-based overcoat whereby warping of said tape carrier is minimized.

2. The tape carrier according to claim 1, wherein said tape carrier further comprises an additional overcoat which is made of an overcoat resin capable of repelling the IC sealing resin and is applied around the periphery of said portion coated with said adhesive resin overcoat.

3. The tape carrier according to claim 1, wherein said adhesive resin overcoat has a high strength of adhesion to the IC sealing resin.

4. The tape carrier according to claim 1, wherein said insulating film is a polyimide resin-based insulating film.

5. The tape carrier according to claim 1, wherein said adhesive resin overcoat is made of a resin which is a member selected from the group consisting of an epoxy resin-based overcoat, an epoxy-acrylate resin-based overcoat, a melamine resin-based overcoat and an alkyd resin-based overcoat.

6. The tape carrier according to claim 1, wherein said adhesive resin overcoat 4b is further applied to an insulating film surface portion around the periphery of a portion coated with the IC sealing resin, said insulating film surface has a side, said pattern surface has a side, the side of said insulating film surface being opposite to said pattern surface.

7. The tape carrier according to claim 6, wherein said polyimide resin-based overcoat is further applied to the insulating film surface portion except for that around the periphery of the portion coated with the IC sealing resin, said insulating film surface has a side, said pattern surface has a side, the side of said insulating film surface being opposite to said pattern surface.

8. A tape carrier comprising an insulating film, a pattern formed of a metal foil on at least one side surface of said film, a polyimide resin-based overcoat and an adhesive resin overcoat, said adhesive resin overcoat being made of a resinous material other than the resinous material of the polyimide resin-based overcoat, said polyimide resin-based overcoat being applied to a pattern surface portion except for that around the periphery of a portion coated with an IC sealing resin, said adhesive resin overcoat being applied around the periphery of an area coated with the polyimide resin-based overcoat, said adhesive resin overcoat extending over said pattern surface portion, said polyimide resin-based overcoat having an area, said adhesive resin overcoat having an area the area of said adhesive resin overcoat being smaller than the area of said polyimide resin-based overcoat whereby warping of said tape carrier is minimized and the adhesiveness of said resin overcoat to the IC sealing resin is enhanced.

9. The tape carrier according to claim 8, wherein said adhesive resin overcoat is further applied to the pattern surface portion around the periphery of the portion coated with the IC sealing resin.

10. The tape carrier according to claim 9, wherein said tape carrier further comprises an additional overcoat which is made of an overcoat resin capable of repelling the IC sealing resin and is applied around the periphery of the portion coated with the adhesive resin overcoat.

11. The tape carrier according to claim 8, wherein said adhesive resin overcoat has a high strength of adhesion to the pattern formed of the metal foil.

12. The tape carrier according to claim 8, wherein said insulating film is a polyimide resin-based insulating film.

13. The tape carrier according to claim 8, wherein said adhesive resin overcoat is made of a resin which is a member selected from the group consisting of an epoxy resin-based overcoat, an epoxy-acrylate resin-based overcoat, a melamine resin-based overcoat and an alkyd resin-based overcoat.

14. The tape carrier according to claim 8, wherein said adhesive resin overcoat 4b is further applied to an insulating film surface portion around the periphery of said portion coated with the IC sealing resin, said insulating film surface has a side, said pattern surface has a side, the side of the insulating film surface being opposite to said pattern surface.

15. The tape carrier according to claim 14, wherein said polyimide resin-based overcoat is further applied to the insulating film surface portion except for that around the periphery of said portion coated with the IC sealing resin, said insulating film surface has a side, said pattern surface has a side, the side of the said insulating film surface being opposite to said pattern surface.

* * * * *